US011286557B2

(12) United States Patent
Cadot et al.

(10) Patent No.: US 11,286,557 B2
(45) Date of Patent: Mar. 29, 2022

(54) METHOD OF FORMING A CRYSTALLINE THIN FILM HAVING THE FORMULA $MY_2$ USING AN ALD-FORMED AMORPHOUS THIN FILM HAVING THE FORMULA $MY_x$ AS A PRECURSOR (71) Applicants: Commissariat A L'Energie Atomique Et Aux Energies Alternatives, Paris (FR); Centre National De La Recherche Scientifique, Paris (FR); Universite Claude Bernard Lyon 1, Villeurbanne (FR); CPE Lyon Formation Continue et Recherche, Villeurbanne (FR)

(72) Inventors: Stéphane Cadot, Genay (FR); Francois Martin, Grenoble (FR); Elsje Quadrelli, Lyons (FR); Chloé Thieuleux, Villeurbanne (FR)

(73) Assignees: Commissariat A L'Energie Atomique Et Aux Engergies Alternatives, Paris (FR); Centre National De La Recherche Scientifique, Paris (FR); Universite Claude Bernard Lyon 1, Villeurbanne (FR); CPE Lyon Formation Continue et Recherche, Villeurbanne (FR)

( * ) Notice: Subject to any disclaimer, the term of this patent is extended or adjusted under 35 U.S.C. 154(b) by 0 days.

(21) Appl. No.: 16/273,510

(22) Filed: Feb. 12, 2019

(65) Prior Publication Data
US 2019/0177838 A1 Jun. 13, 2019

Related U.S. Application Data (63) Continuation-in-part of application No. 14/603,829, filed on Jan. 23, 2015, now abandoned.

(30) Foreign Application Priority Data

Jan. 24, 2014 (FR) .................................. 14.50598

(51) Int. Cl.
*C23C 16/30* (2006.01)
*C23C 16/455* (2006.01)
(Continued)

(52) U.S. Cl.
CPC ...... *C23C 16/305* (2013.01); *C23C 16/45536* (2013.01); *C23C 16/45553* (2013.01);
(Continued)

(58) Field of Classification Search
CPC . C23C 16/305; C23C 16/46; C23C 16/45536; C23C 16/4408; C23C 16/4402;
(Continued)

(56) References Cited

U.S. PATENT DOCUMENTS 3,399,962 A * 9/1968 Silverman .............. C01G 41/00
423/565
3,472,621 A * 10/1969 Silverman .............. F16C 33/10
423/509
(Continued)

OTHER PUBLICATIONS

Balendhran ("Two-Dimensional Molybdenum Trioxide and Dichalcogenides", Balendhran et al, Adv. Funct. Mater. 2013, 23, 2952-3970) (Year: 2013).*
(Continued)

*Primary Examiner* — Michael B Cleveland
*Assistant Examiner* — Michael G Miller
(74) *Attorney, Agent, or Firm* — Burr & Brown, PLLC (57) ABSTRACT A method of preparing a crystalline thin film having a formula $MY_2$ includes (1) preparing an $MY_x$ amorphous film by atomic layer deposition on a surface of a substrate, and (2) annealing the amorphous $MY_x$ film at 350° C. or more to provide the crystalline $MY_2$ film. The amorphous $MY_x$ film
(Continued)

is formed from at least one metal M precursor and at least one element Y precursor, wherein x is 1.5 to 3.1, M is tungsten or molybdenum, and Y is sulfur or selenium. Step (1) includes a) introducing a first metal M precursor or element Y precursor into a deposition chamber, b) purging with inert gas, c) introducing a second metal M precursor when the first precursor is element Y, or element Y precursor when the first precursor is metal M, d) purging with inert gas, e) repeating steps a) to d), and f) obtaining the amorphous $MY_x$ film.

21 Claims, 3 Drawing Sheets (51) Int. Cl.
   *C23C 16/56* (2006.01)
   *C23C 16/46* (2006.01)
   *C23C 16/44* (2006.01)
(52) U.S. Cl.
   CPC ............. *C23C 16/46* (2013.01); *C23C 16/56* (2013.01); *C23C 16/4408* (2013.01)
(58) Field of Classification Search
   CPC .............. C23C 16/45555; C23C 16/56; C23C 16/45553
   USPC .................................................. 427/569–579
   See application file for complete search history.

(56) References Cited

U.S. PATENT DOCUMENTS

| | | | | |
|---|---|---|---|---|
| 4,867,840 A | * | 9/1989 | Roxlo | ............... B01J 27/02 216/66 |
| 6,200,893 B1 | | 3/2001 | Sneh | |
| 6,284,366 B1 | * | 9/2001 | Konig | ............... C23C 16/305 428/336 |
| 6,969,539 B2 | * | 11/2005 | Gordon | ............... C07F 9/091 427/255.29 |
| 2006/0286810 A1 | | 12/2006 | Delabie | |
| 2010/0048029 A1 | * | 2/2010 | Kumar | ............... C23C 16/50 438/758 |
| 2010/0166981 A1 | | 7/2010 | Dominguez | |
| 2011/0120875 A1 | | 5/2011 | Norman | |
| 2015/0170907 A1 | * | 6/2015 | Haukka | ............. H01L 21/02175 438/779 |

OTHER PUBLICATIONS

Gordon ("Overview of ALD Precursors and Reaction Mechanisms", Gordon, Roy G. 2011. Paper presented at The 11th International Conference on Atomic Layer Deposition, Cambridge, MA, Jun. 26-29, 2011.) (Year: 2010).*

Bradley (Bradley and Chisholm, "Covalent Compounds of Quadrivalent Transition Metals. Part V. Molybdenum(iv) Dialkylamides," J. Chem. Soc. A, 1971, 0, 2741-2744) (Year: 1971).

T.W. Scharf et al., "*Growth, Structure, and Tribological Behavior of Atomic Layer-Deposited Tungsten Disulphide Solid Lubricant Coatings with Applications to MEMS*," ACTA Materialia, vol. 54, No. 18, Oct. 2006, pp. 4731-4743.

Database Compendex, T.W.Scharf et al., "*Atomic Layer Deposition of Solid Lubricant Thin Films*," Proceedings of the World Tribology Congress III—2005, American Society of Mechanical Engineers, 2005, pp. 375-376.

French Search Report (Application No. 14.50598) dated Jul. 17, 2014.

Li et al. ("WS2 thin films prepared by solid state reaction (induced by annealing) between the constituents in thin film form," Li, S J, et al, J. Phys: Condens. Matter 8 (1996) 2291-2304).

Miikkulainen et al ("Crystallinity of inorganic films grown by atomic layer deposition: Overview and general trends," Miikkulainen et al, Journal of Applied Physics 113, 021301 (2013)).

Scharf et al ("Atomic layer deposition of tungsten disulphide solid lubricant thin films," Scharf et al, J. Mater. Res., vol. 19, No. 12, Dec. 2004, pp. 3443-3446).

\* cited by examiner

METHOD OF FORMING A CRYSTALLINE THIN FILM HAVING THE FORMULA $MY_2$ USING AN ALD-FORMED AMORPHOUS THIN FILM HAVING THE FORMULA $MY_x$ AS A PRECURSOR

CROSS-REFERENCE TO RELATED APPLICATIONS

This application is a Continuation-In-Part of U.S. application Ser. No. 14/603,829, filed Jan. 23, 2015 and claims the benefit under 35 USC § 119(a)-(d) of French Application No. 14.50598, filed on Jan. 24, 2014, the entirety of which are incorporated hereby by reference.

BACKGROUND OF THE INVENTION

1. Field of the Invention

The invention relates to a method of forming a thin-film material of $MY_x$ type, M being tungsten and/or molybdenum, and Y being sulfur and/or selenium.

The present invention can particularly be used in electronics.

2. Description of Related Art

The use of materials of $MY_x$ type (M=Mo, W; Y=S, Se) in catalysis or in the field of lubricant coatings has caused the development of various manufacturing techniques, and more specifically:

- the sulfiding of metal oxides $MoO_3$ and $WO_3$ with $H_2S$ or with a $H_2/H_2S$ mixture;
- the thermal decomposition of thiomolybdates or of thiotungstates;
- reactive sputtering;
- the decomposition (thermal and/or tribological) of molybdenum or tungsten dithiocarbamates, thiophosphates, or thioxanthates;
- the chemical vapor deposition (CVD) by reaction between a precursor of the metal such as $MoF_6$, $MoCl_5$, or $Mo(CO)_6$, and a sulfur precursor such as sulfur hydrogen or elemental sulfur;
- single precursor chemical vapor deposition (CVD) by thermal decomposition of molybdenum dithiocarbamates or tetrathiolate (IV); and
- the deposition of a material of $MY_2$ type ($WS_2$) by atomic layer deposition (ALD) from volatile halogenated precursors of the metal ($WF_6$).

However, such methods generally result in:

- porous deposits; or
- deposits systematically containing impurities, particularly O, C, Cl, and F, given that the only examples of direct ALD of $MoS_2$ or $WS_2$ described to date use Mo and W chlorides or fluorides; or
- the forming of corrosive by-products such as HF and HCl capable of deteriorating the substrate.

Further, they do not enable to accurately control the thickness and the homogeneity of the deposit forming the thin film.

On the other hand, the thin film obtained according to such methods has crystal planes which do not all have the same direction relative to the substrate having the deposition performed thereon. In other words, such methods generally do not enable to control the orientation of the crystal planes in the deposited film. Although, for example, this feature is not a disadvantage in catalysis, it may be a problem, particularly for a use in electronics.

Other examples of prior art methods enabling to form $MoS_2$-type thin film comprise:

- sulfiding a preformed deposit of $MoO_2$ with elemental sulfur at 1,000° C.;
- depositing by CVD oxide $MoO_3$ and elemental sulfur at 650° C.;
- the physical transport of $MoS_2$ in vapor phase at 900° C.;
- depositing by CVD $MoCl_5+H_2S$ at 600° C. This method enables to form an oriented film of 50 nanometers of $MoS_2$. However, it does not enable to optimally cover the substrate as soon as the first nanometers have been deposited; and
- performing a reactive sputtering, which may also enable to form an oriented deposit. However, this method does not enable to very accurately control the thickness, particularly due to the lack of homogeneity of the deposit. Indeed, such a technique enables to control the thickness of the deposit to within a few tens of nanometers.

However, such techniques have the disadvantage of generally requiring very high temperatures, often higher than 650° C., which are incompatible with integrated circuit manufacturing methods. Further, they generally do not allow a controlled forming of hybrid films, that is, a film containing a mixture of different elements M and/or of different elements Y which have been successively deposited.

An option is to exfoliate $MY_2$ films by means of an adhesive. However, such a technique is limited in terms of reproducibility and of applicability at a large scale. Further, it does not enable to form hybrid thin films at an industrial scale. It generally requires a very pure and very crystalline material.

To overcome these problems, the Applicant has developed a method enabling to prepare, in mild conditions (deposition temperature lower than 350° C., no halogenated impurities), an $MY_x$-type thin film by successive self-limited depositions of a precursor containing M and of another precursor containing Y, followed by a crystallization annealing at higher temperature. Thus, this method enables not only to control the thickness of the thin film more accurately than prior art methods, but also to form hybrid films.

SUMMARY OF THE INVENTION

The present invention relates to a method of preparing an amorphous $MY_x$ thin film as a precursor in the fabrication of oriented crystalline $MY_2$ thin layers. As opposed to a crystalline material, an amorphous material does not have a long-range order or any translational periodicity. Atomic positions do not repeat in a regular array in an amorphous material.

This method allows the formation of a crystalline film, or crystalline layer(s), of $MoS_2$, $MoSe_2$, $WS_2$ and $WSe_2$ having basal planes (001) parallel to the plane of the substrate, without requiring lattice compatibility between the substrate and the $MY_2$ layer (for instance on amorphous $SiO_2$).

The $MY_2$ (Y=S or Se) formula relates to the overall stoichiometry of the crystalline thin film. It does not include M and Y atoms present at the interface between the $MY_2$ layers and the substrate (or optional protective layer—see below). This stoichiometry may slightly vary due to local defects (e.g. chalcogen vacancies at the grain boundaries).

"Thin film" means a layer of material having its thickness advantageously in the range from 0.5 to 100, preferably 20 nanometers or less, more advantageously smaller than 10 nanometers, and more advantageously still smaller than 5 nanometers. In general, above 10 nm, preferably above 20 nm, the formation of a crystalline film having basal planes parallel to the plane of the substrate becomes less energetically favorable.

In relatively mild conditions in terms of implementation (deposition) temperature, the method forming the object of the invention enables to control the thickness and the stoichiometry of the $MY_x$ thin film. It enables forming an amorphous deposit, which crystallizes upon subsequent thermal annealing, leading to a $MY_2$ layered film having basal planes parallel to the substrate on which the film is formed.

Further, the method according to the present invention also enables to form a hybrid $MY_x$ thin film where M is molybdenum and/or or tungsten and Y is sulfur and/or selenium.

More specifically, the object of the present invention relates to a method of preparing by ALD an amorphous thin film of formula $MY_x$, x being in the range from 1.5 to 3.1 (step (1) below). The subsequent annealing of this thin film yields a crystalline $MY_2$ film (step (2) below).

This method comprises two main steps:
(1) the step of depositing by ALD an amorphous $MX_y$ thin film, and
(2) the step of forming a crystalline $MY_2$ thin film by annealing the $MX_y$ thin film.

This method comprises the step of depositing by ALD ("Atomic Layer Deposition") a thin film $MY_x$ (a film containing M and X elements) on a substrate from at least one precursor of metal M, and at least one precursor of element Y;

M being tungsten and/or molybdenum (in other words, M is selected from the group formed of tungsten, molybdenum, and or the tungsten/molybdenum mixture);
the degree of oxidation of metal M in the precursor of metal M being in the range from 3 to 6, preferably equal to 3, 4, or 6, and more advantageously still equal to 4 or 6;
the metal of the precursor of metal M only comprising M-Z and/or M-M bonds with Z=C, N, H, and any combination of these atoms;
Y being sulfur and/or selenium (in other words, Y is selected from the group formed of sulfur, selenium, and or the sulfur/selenium mixture); and
the substrate temperature being lower than or equal to 350° C.

Annealing this ALD deposited film affords a specific crystalline $MY_2$ film.

More specifically, the invention relates to a method of preparing a crystalline thin film of formula $MY_2$, wherein the method comprises:
(1) preparing an amorphous film having the formula $MY_x$, by atomic layer deposition (ALD) on a substrate, from at least one precursor of metal M and at least one precursor of element Y,
wherein x is in the range from 1.5 to 3.1,
wherein M is tungsten or molybdenum,
wherein a degree of oxidation of metal M in the at least one precursor of metal M is in the range from 3 to 6,
wherein the metal of the precursor of metal M only comprises simple or multiple bonds M-Z and/or M-M with Z=C, N, H, and any combination of these atoms,
wherein Y is sulfur or selenium,
wherein the precursors of metal M and of element Y are halogen free, and
wherein preparing the amorphous of formula $MY_x$ comprises the steps of
a) introducing, by a single pulse, a first precursor of metal M or of element Y into a deposition chamber of an ALD reactor,
b) purging the deposition chamber with an inert gas,
c) introducing, by a single pulse, a second precursor into the deposition chamber, the second precursor being a precursor of metal M when the first precursor is a precursor of element Y, or a precursor of element Y when the first precursor is a precursor of metal M,
d) purging the deposition chamber with an inert gas,
e) repeating steps a) to d) in order to provide the amorphous film having the formula $MY_x$,
wherein a substrate temperature is lower than or equal to 350° C., during steps a) to d) to avoid the formation of crystals that are randomly oriented with respect to the substrate, and
f) obtaining an amorphous film having the formula $MY_x$ having a thickness of less than 100 nanometers; and
(2) annealing the amorphous film of formula $MY_x$ at a temperature of 350° C. or more (≥350° C.) to provide a crystalline film having a formula $MY_2$, wherein the crystalline film has crystal lattices whose basal planes are stacked in planes parallel to the surface of the substrate on which the crystalline film is formed.

The specific conditions of this method allow the formation of a crystalline thin film in a quick and efficient two-step method. Contrary to prior art such as US 2015/0170907, the present invention allows the formation of a crystalline thin film comprising one or two metals (W and/or Mo). US 2015/0170907 teaches that the combination of two metals is beneficial since it suppresses crystallization at elevated temperatures.

Contrary to prior art such as US 2015/0170907, the method according to the present invention allows the formation of a crystalline thin film having specifically oriented crystals. This is due to the specific selection of the process sequence and conditions, such as temperatures in steps (1) and (2) and nature of the metal and chalcogen (Y) precursors.

As already mentioned, at the end of step (1), the film contains M and Y, with an Y/M atomic ratio between 1.5 and 3.1. The annealing step (2) affords the $MY_2$ thin film wherein the Y/M atomic ratio is 2. In the $MY_x$ film of step (1), the presence of interfacial states between the substrate and the MYx layer may result in Y/M atomic ratios lower than 2, especially in the case of ultrathin deposits (less than 3 nm). These interfacial states are not included when considering the stoichiometry in the crystalline $MY_2$ film obtained after annealing since the $MY_2$ crystals are naturally separated from the substrate by a Van der Waals gap (see FIG. 5).

The above-mentioned M-Z and M-M bonds are bonds which may be simple or multiple.

Advantageously the thin layer obtained after step (1) of the ALD process is of formula $MY_x$, wherein x is in the range from 1.8 to 3.1, more advantageously from 1.9 to 3, and more advantageously still from 2 to 3. According to a particularly advantageous embodiment, x=2. According to a particular embodiment, x may vary between 1.5 and 4.

Typically, techniques used to analyze a thin film of formula $MY_x$, wherein x is preferably 2, include the following techniques:
X-ray photoelectron spectrometry: XPS;
Raman spectrometry;

X-ray fluorescence spectrometry: XRF;
high-resolution transmission electron microscopy: HRTEM;
elemental analysis;
energy-dispersive spectrometry analysis: EDS or EDX ("energy dispersive X-ray spectrometry"); and
secondary ion mass spectrometry: SIMS.

Generally, the measurement device may be previously calibrated on a reference sample according to a conventional operating mode within the abilities of those skilled in the art.

Specific Embodiments of the Method According to the Invention

The ALD of the $MY_x$ thin film (film containing M and Y) is carried out in an enclosure where the precursors of metal M and of element Y are introduced separately. In accordance with the implementation of the ALD technique, the precursors are introduced into a deposition chamber, in alternated fashion, and in gaseous form, to control the forming of the thin film. Indeed, upon simultaneous introduction, the precursors might react together before reaching the substrate on which the thin film is formed, yielding a rough thin film with poor uniformity and control over the thickness.

The precursors are generally introduced in gaseous form. They are transported to the deposition area by an inert gas (argon or nitrogen, for example). However, and according to a specific embodiment, they may be introduced in diluted form in a sufficiently volatile solvent of low reactivity (toluene, benzene, hexane, for example). This diluted precursor solution is then atomized in the carrier gas flow in the form of a spray.

Each precursor is introduced by "pulse." Each pulse corresponds to the transport to the substrate of one of the precursors by a gas flow, for a time period necessary to obtain an optimum coverage of the substrate. It will be within the abilities of those skilled in the art to adjust the necessary parameters according to conventional ALD methods. The duration of a pulse may particularly depend on the nature of the instrument used. Thus, and as a non-limiting example, it may be in the range from a few milliseconds to several minutes, for example, from 100 milliseconds to 10 minutes.

According to a specific embodiment, the ALD (atomic layer deposition) comprises introducing into a deposition chamber at least one precursor of metal M, and then introducing at least one precursor of element Y.

According to another specific embodiment, the ALD comprises introducing into a deposition chamber at least one precursor of element Y, and then introducing at least one precursor of metal M.

The ALD may thus comprise the steps of:
a) introducing a first precursor of metal M or of element Y into a deposition chamber;
b) optionally, purging the deposition chamber with an inert gas (argon or nitrogen, for example) to eliminate the species which have not reacted;
c) introducing a second precursor into the deposition chamber, the second precursor being a precursor of metal M when the first precursor is a precursor of element Y or a precursor of element Y when the first precursor is a precursor of metal M;
d) optionally, purging the deposition chamber with an inert gas (argon or nitrogen, for example) to eliminate the species which have not reacted; and
e) repeating steps a) to d).

Generally, the introduction of the first precursor is preceded by a step of purging the deposition chamber. The inert purge gas generally is argon or nitrogen. It may be any gas which does not react with the precursors.

Steps a) to d) are generally repeated until a thin film having the desired thickness is obtained. The precursors used in the so-called repetition steps may be identical to the precursors initially used or different therefrom. For example, precursors of molybdenum of different nature may be used to form a $MoY_x$ (molybdenum-containing film) thin film. Precursors of different metals may also be used to form a hybrid thin film containing both molybdenum and tungsten. The same applies for the precursor(s) of Y.

Thus, and generally, the ALD may comprise, on the one hand, the introduction of precursors of the tungsten and/or molybdenum metals, and on the other hand the introduction of precursors of the sulfur and/or selenium elements. This specific embodiment enables to form a hybrid thin film containing a mixture of Mo and/or W and S and/or Se.

On introduction of the first precursor, the surface of the substrate is advantageously saturated with metal M or with element Y, to form a homogeneous deposition which advantageously covers the entire substrate. Each subsequent introduction of a precursor of M or of Y enables to saturate the surface of the previously-deposited film.

As already mentioned, the precursors of metal M and of element Y are introduced in alternated fashion. The order of introduction may in particular depend on the nature of the substrate.

For example, and according to a specific embodiment, particularly when the substrate is of metal oxide or organic oxide type, the method may comprise the following pulse sequence:
precursor of metal M,
precursor of element Y,
precursor of metal M, and
precursor of element Y.

According to another specific embodiment, particularly when the substrate is made of a metal (nickel, copper, or gold, for example), the method may comprise the following pulse sequence:
precursor of element Y,
precursor of metal M,
precursor of element Y,
precursor of metal M, and
precursor of element Y.

It will be within the abilities of those skilled in the art to adapt the frequency and the repetition of the pulses according to the desired substrate coverage rate.

For instance, a duration of the single pulses of steps a) to d) is less than 30 seconds.

The ALD particularly comprises taking the precursors to the temperature necessary to obtain a vapor pressure sufficient for the working pressure. The precursor is then transported to the substrate by a gas flow which may be inert or reactive. It will be within the abilities of those skilled in the art to adjust the quantity of precursor to be injected for each pulse, and to implement the ALD.

In the context of the present invention, the ALD of the $MY_x$ thin film (film containing M and Y) is performed at a temperature lower than or equal to 350° C. In other words, and as already indicated, the substrate temperature is lower than or equal to 350° C. It more advantageously ranges from 0 to 350° C., and more advantageously still from 120 to 300° C. According to another particularly advantageous embodiment, the temperature is in the range from 20 to 350° C., advantageously from 20 to 300° C., even more preferably between 60 and 150° C.

The deposition temperature may be adapted according to the nature of the couple of precursors used. It will be within the abilities of those skilled in the art to adapt the deposition temperature according to the nature of the couple of precursors used.

However, in case of hybrid deposits, the precursors are advantageously selected in order to react at the same temperature, thus avoiding time consuming heating up and cooling down sequences between each ALD pulse. In other words, the ALD is advantageously performed at the same temperature in steps a) though e).

The ALD (step (1)) may also be carried out under low pressure i.e. below atmospheric pressure.

Generally, the method according to the invention is applicable to a large-scale production, and enables to obtain a $MY_x$ thin film while providing the following technical effects:
- accurate control of the thickness of the deposit;
- the possibility of preparing hybrid thin films;
- lack of impurities related to elements O, F, Cl, Br, and I;
- deposition performed at low temperature ($\leq 350°$ C.); and
- no release of dihalogen compounds or of hydrogen halogenides which would not only corrode the reactor, but also the deposit and the substrate.

Precursors

Generally, the precursors of metal M and of element Y are advantageously thermally stable at the ALD temperature. On the other hand, they have a vapor pressure suited to the working pressure and a reactivity enabling them to be implemented by ALD, at a temperature lower than or equal to 350° C.

The precursors of metal M are compounds comprising ligands, that is, groups directly bonded to metal M. On forming of the $MY_x$ thin film, such ligands are advantageously integrally substituted with elements Y. The ligands which are not substituted with elements Y are generally eliminated during the subsequent annealing step described hereafter.

As already indicated, the precursor of metal M is a compound of tungsten or of molybdenum comprising M-Z and/or M-M bonds with Z=C, N, H, and any combination of these atoms. The bonds may be simple, double, or triple covalent bonds. Advantageously, it only comprises M-Z bonds. However, and according to a specific embodiment, the metal of the precursor of metal M exclusively comprises simple and/or double bonds with nitrogen.

Further, the precursor of metal M comprises no halogens. It is also preferably oxygen-free.

The precursor of metal M is preferably free of Cp ligands such as cyclopentadienyl.

It is generally a monometallic or bimetallic compound. Preferably, it is a monometallic compound having a degree of oxidation equal to 4 or 6.

Advantageously, the precursor of metal M is selected from the group comprising compounds $Mo(NMe_2)_4$; $M(=N-CMe_3)_2(NMe_2)_2$; $Mo(NEtMe)_4$; $Mo(NEt_2)_4$; and $M_2(NMe_2)_6$; with M=molybdenum or tungsten, Me=$-CH_3$, Et=$-CH_2-CH_3$.

More advantageously still, the precursor of metal M is $Mo(NMe_2)_4$, $Mo(NEtMe)_4$; $Mo(=N-CMe_3)_2(NMe_2)_2$; or $W(=N-CMe_3)_2(NMe_2)_2$. In this case, the temperature for implementing the method is advantageously in the range from 20 to 350° C.

As concerns the precursor of element Y, it is advantageously deprived of halogens and of oxygen.

Typically, the precursor of element Y may be selected from the group comprising $YR_2$; $Y_2R$; $Y_2R_2$; $Y_3R_2$; $Y_2R_3$ (with R=H and/or alkyl and/or allyl and/or aryl; and R=C in the case of $Y_2R$).

The above-mentioned alkyl group R is advantageously a linear or branched alkyl comprising from 1 to 8 carbon atoms, and more advantageously still from 1 to 4 carbon atoms.

The precursor of element Y may be used alone or mixed with hydrogen. The $Y_2R_2$ and $Y_3R_2$ compounds are advantageously used mixed with hydrogen. The hydrogen may advantageously be in plasma form.

The precursor of element Y may particularly be selected from the group comprising methyl disulphide; ethyl disulphide; methyl diselenide; ethyl diselenide; and 1,2-ethanedithiol ($Y_2R_3$=HS—$C_2H_4$—SH).

According to a preferred embodiment, the precursor of element Y may be:
- $H_2Y$ alone; or
- 1,2-ethanedithiol (HS—$CH_2CH_2$—SH) alone; or
- a $H_2/Y_2R_2$ mixture.

According to a specific embodiment, the way in which the precursor of element Y (alone or mixed with hydrogen) is employed (introduction into the deposition enclosure by ALD) may be plasma-assisted. The presence of a plasma may thus enable to lower the deposition temperature. Generally, this specific embodiment does not concern the precursor of metal M.

According to a preferred embodiment, the precursor of element Y is $H_2Y$, alone or mixed with hydrogen.

The introduction of the precursor of element Y into the deposition chamber may also be followed by a hydrogen pulse which enables to clean possible traces of remaining ligand and to reactivate the surface for the next pulse of the precursor of M.

As indicated hereabove, a mixture of precursors may also be used. For example, a possible mixture of hydrogen/alkyl polysulphide such as dimethyl disulphide DMDS or diethyl disulphide DEDS, may be used. This mixture generates in-situ a mixture of thiols and of $H_2S$ when the temperature is greater than or equal to 150° C. and in the presence of Mo or W.

Further, the use of a mixture containing a precursor of element Y and hydrogen may have the following advantages:
- possibility of obtaining an oxidizing or reducing mixture (capable of comprising a plurality of compounds which are precursors of element Y) according to temperature and to the hydrogen content, thus enabling to better control the Y/M ratio;
- the presence of hydrogen promotes the forming of —YH groups at the substrate surface. The presence of such groups is particularly advantageous due to their better reactivity towards the precursor of metal M than —Y-alkyl groups;
- as a variation, a hydrogen plasma may be used as a carrier gas for an alkyl disulphide or diselenide, thus enabling to lower the reaction temperature by forming radicals Y• of higher reactivity.

Annealing

The method according to the invention comprises a second step (2) of annealing step after the ALD sequence of step (1). The annealing step is necessary for converting the amorphous deposit into a crystalline $MY_2$ layer. In other words, at the end of the forming of the thin film of formula $MY_x$, the annealing step enables to form a crystalline thin film advantageously having formula $MY_2$. Indeed, upon annealing, the possible excess of compound Y is eliminated while the most stable phase of formula $MY_2$ is formed. Accordingly, at the end of the anneal, x is equal to 2.

As already indicated, the ALD process (step (1)) enables to control the formation of the amorphous thin film at the end of the deposition (step e)).

However, and advantageously, the ALD temperature does not enable the $MY_x$ thin film (film containing M and Y elements) to crystallize. This condition particularly enables to avoid the formation of $MY_2$ crystals randomly oriented with respect to the substrate.

Thus, the nature of the precursors used enables to operate at a temperature lower than the crystallization temperature of material $MY_x$, towards the target $MY_2$ material. Only at the end of its forming can the $MY_x$ thin film be crystallized, during an annealing step.

Alternatively, a thin protective layer can be applied on the amorphous $MY_x$ material resulting from step e). It may also be applied onto the crystalline film $MY_2$, after step (2). This layer acts as a protective layer against oxidation. Such a protective layer may comprise (but not exclusively) any one of $SiO_2$, $SiN_x$, $Al_2O_3$, $HfO_2$, $ZrO_2$ or $Ta_2O_5$. As already mentioned, it may be carried out before or after step (2).

The protective layer has a thickness that preferably ranges from 0.5 nm to 1 µm, preferably from 2 nm to 50 nm.

The Applicants have found that applying a protective layer between step (1) and step (2) prevents the loss of chalcogen atoms (S and/or Se) at higher temperature, during the later annealing step (2).

The method may also comprise a pre-annealing stage, which is preferably carried out under argon or hydrogen, at 500° C. or less (≤500° C.), preferably between 200 and 550° C. This optional stage is carried between steps (1) and step (2). When the method includes depositing a protective layer, the pre-annealing stage is preferentially carried out before the formation of the protective layer.

For instance, any of the following embodiments may be implemented:
step (1)—step (2)—protective layer;
step (1)—protective layer—step (2);
step (1)—pre-annealing—step (2); and
step (1)—pre-annealing—protective layer—step (2).

On anneal, the thin film is densified. The growth of $MY_2$ layered compound occurs with its basal planes oriented parallel to the substrate. Thus, and advantageously, the thin film forms a crystal lattice having its basal planes (slabs; 001) advantageously stacked in planes parallel to the surface of the substrate on which it is formed.

Typically, the anneal temperature is advantageously in the range from 200 to 1,000° C., more advantageously from 350 to 700° C. The anneal temperature may also range from 450 to 1100° C., preferably from 650 to 1050° C.

For instance, a duration of the annealing (step (2)) may be less than 5 minutes, preferably at least 30 seconds.

Generally, the anneal is carried out under vacuum or under an inert atmosphere (nitrogen, argon . . . ) to avoid a reaction of the oxygen of air with the deposit.

Advantageously, the anneal temperature may be in the range from 800 to 850° C. under argon, or from 450 to 500° C. under hydrogen.

As already mentioned, a pre-annealing under hydrogen can be applied to the film at a temperature comprised in the range from 200 to 550° C. This pre anneal step occurring between step (1) and step (2) may be carried out in order to decrease carbon levels of the deposit resulting from step (1) and also in order to remove extra sulfur content before the crystallization annealing. This embodiment is also particularly adapted before applying a protective layer, to avoid its sintering during step (2), due to an outgassing of ligand residues that may be present in the $MY_x$ film after step (1).

The advantages linked to the two-step process (low-temperature deposition (1) followed by a crystallization post-annealing (2)):

low roughness of the surface, as compared with prior art thin layers for which the high-temperature deposition generally promotes a growth at the $MY_2$ edges, which results in flower-like, microsphere, or microtube structures; and possibility to obtain $MY_2$ alloys (where M is a mixture of Mo and W, and Y a mixture of S and Se) control of the orientation of the crystal planes according to the anneal conditions and to the nature of the substrate, with for example the possibility of obtaining crystal slabs having their basal planes oriented parallel to the plane of the substrate having the thin film deposited thereon.

Substrate

As already indicated, the order of introduction of the M or Y precursors may depend on the nature of the substrate.

The deposition is performed on a substrate which may be heated, so that its temperature is sufficient to observe a self-limited growth with no residue or non-controlled thermal decomposition of the precursors.

The surface of the substrate having the thin film deposited thereon is advantageously made of a material selected from the group comprising a metal; a semiconductor; a polymer; an organic substrate; an inorganic oxide; a metal oxide; a metal sulfide; a metal selenide; an inorganic sulfide; and an inorganic selenide.

The semiconductor substrates may particularly be made of silicon or of germanium.

Generally, the surfaces having —OH, —SH, —SeH terminations are particularly adapted to the pulses of a metal precursor, that is, the initial introduction of a precursor of metal M while metal surfaces are generally better adapted to the initial introduction of the precursor of element Y.

According to a specific embodiment, before implementation of the method according to the invention, the substrate may be submitted to a chemical processing aiming at forming or at introducing the previously-mentioned —OH, —SH, or —SeH terminations. The controlled hydration of a support of metal oxide type will for example enable to make the surface reactive by forming —OH groups. Further, the grafting of compounds of chloro- or alkoxy-silane type having a functionality reactive towards the precursor of metal M may be implemented before the deposition of the $MY_x$ thin film.

Thin Film and Use Thereof

The present invention relates to the $MY_x$ thin film capable of being obtained by the above-described method, but also to its use, particularly in electronics.

The fields of use of the thin film particularly include photovoltaics and the hydrogen evolution reaction (HER).

The $MY_x$ thin film may comprise a surface layer which is partially or totally oxidized, particularly by being exposed to air. In this case, it may be considered as a layer of protection of the $MY_x$ thin film material.

On the other hand, a surface layer (of graphite or metal oxide or metal nitride type) may be deliberately arranged at the end of the process to passivate the $MY_x$ film. This optional step may be carried out before or after the anneal.

BRIEF DESCRIPTION OF THE DRAWINGS

The present invention and the resulting advantages are better understood from the following non-limiting drawings and examples, provided as an illustration of the present invention, in which.

DETAILED DESCRIPTION OF THE INVENTION

Deposition of a $MoS_{1.8}$ thin film (M=Mo; Y=S; x=1.8) from tetrakis(dimethylamino)molybdenum (IV) and 1,2 ethanedithiol according to the method of the invention.

The deposition is performed on a $SiO_2$ substrate having a 275-nm thickness in an ALD reactor, by alternating pulses of tetrakis(dimethylamino)molybdenum (IV) $Mo(NMe_2)_4$ and 1,2-ethanedithiol, preceded by a purging cycle (60 sccm of argon at a 10-torr pressure, that is, 1,333 Pa, for 2 minutes). (1 sccm=1 standard $cm^3$/minute).

The substrate (and the sample being formed) is maintained at 100° C. all along the deposition.

The tetrakis(dimethylamino)molybdenum (IV) is saturated at 20° C./10 Torr in a 40-sccm argon flow.

The duration of the pulse for the metal precursor is 5 minutes.

The 1,2-ethanedithiol (≥98%, from Sigma-Aldrich) is saturated at 20° C./760 Torr in a 60 $cm^3$/minute argon flow.

The duration of the pulse for the sulfided precursor is 5 minutes.

In the end, five "metal precursor—purging—sulfur precursor—purging" cycles are carried out.

The sample is then annealed for 10 min at 800° C. under a continuous argon flow (10 Torr, 100 sccm).

Figure 1:
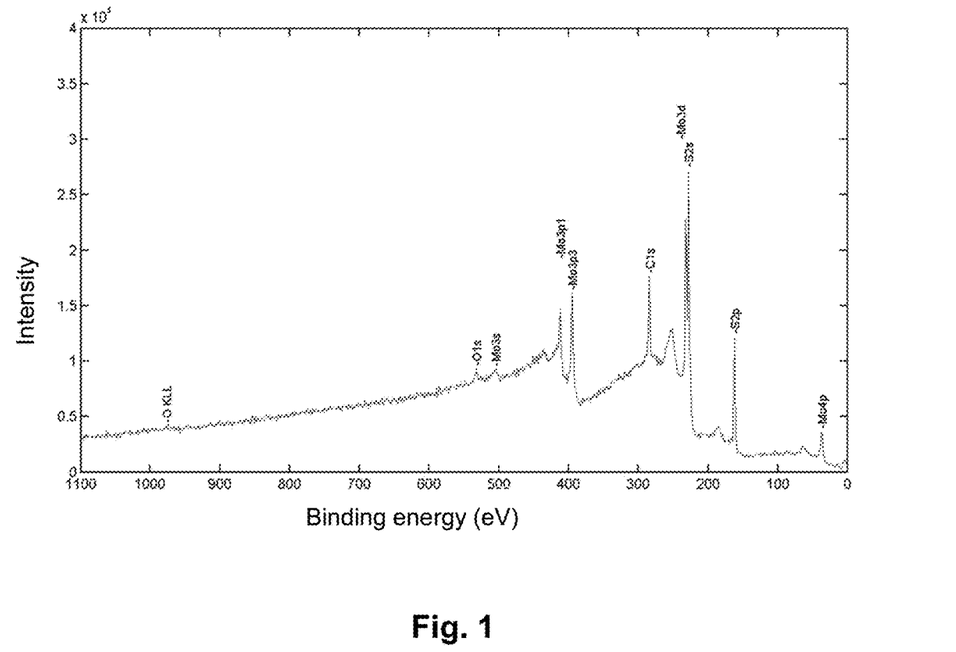
FIG. 1 illustrates the general XPS spectrum of a $MoS_{1.8}$ sample obtained according to the method of the invention.
Figure 2:
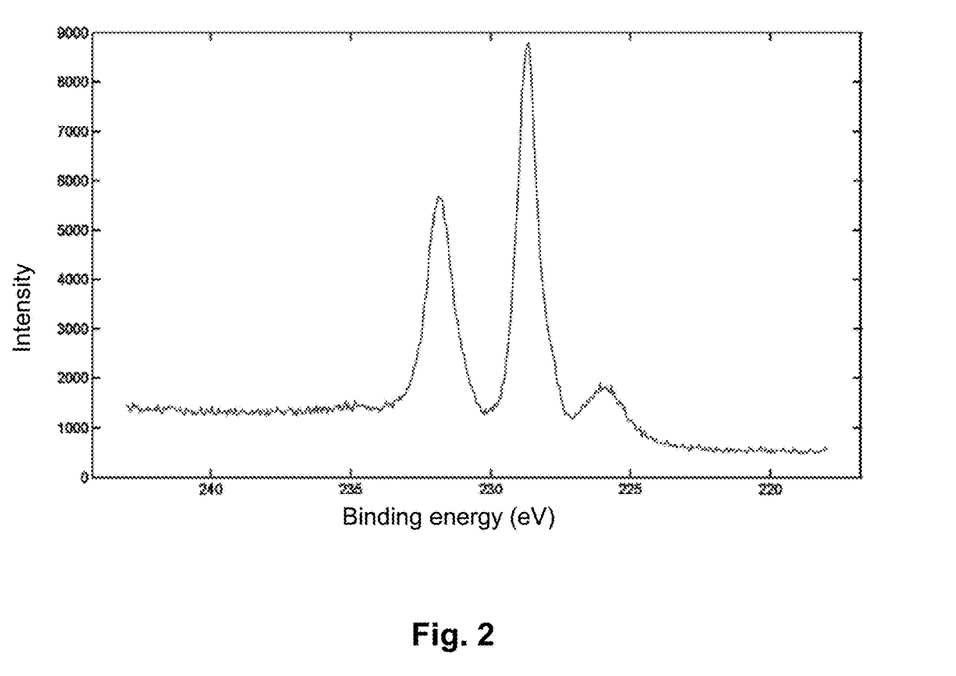
FIG. 2 illustrates the high-resolution XPS spectrum ($Mo_{3d}$ lines) of a $MoS_{1.8}$ sample obtained according to the method of the invention.
Figure 3:
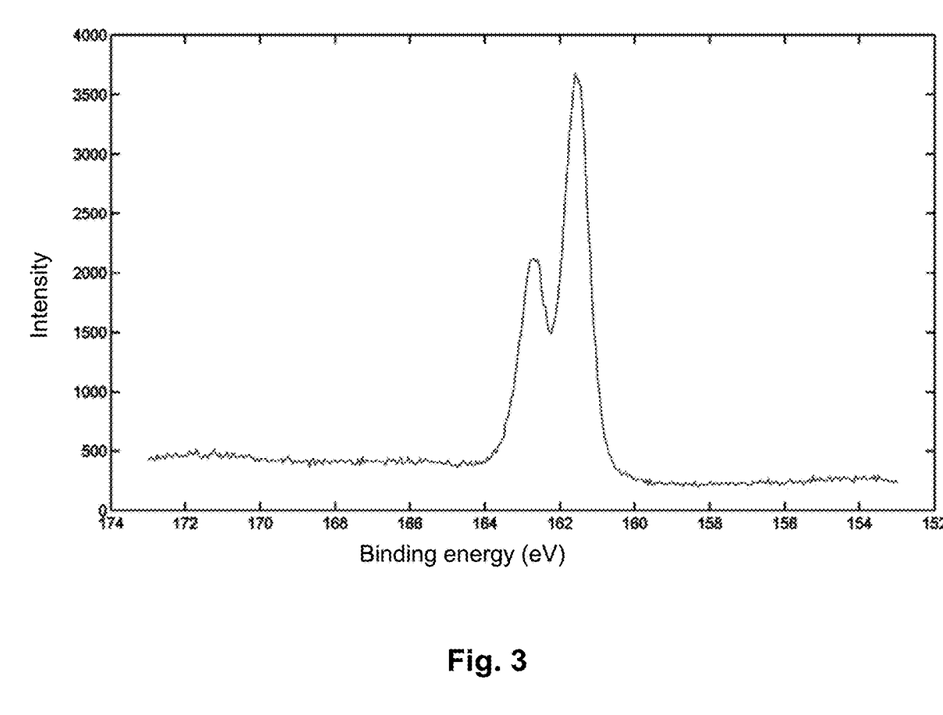
FIG. 3 illustrates the high-resolution XPS spectrum ($S_{2p}$ lines) of a $MoS_{1.8}$ sample obtained according to the method of the invention.

Analyses by XPS (X-ray photoelectron spectrometry) reveal a phase very close to the $MoS_2$ stoichiometry with a ratio S/Mo=1.8 (assessed from the $Mo_{3d}$ and $S_{2p}$ lines, FIGS. 1 to 3).

Figure 4:
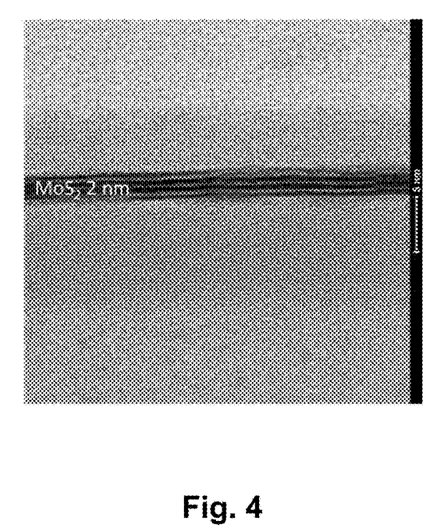
FIG. 4 is a STEM cross-section view of a $MoS_2$ thin film (2 nm) obtained according to the method of the present invention.
Figure 5:
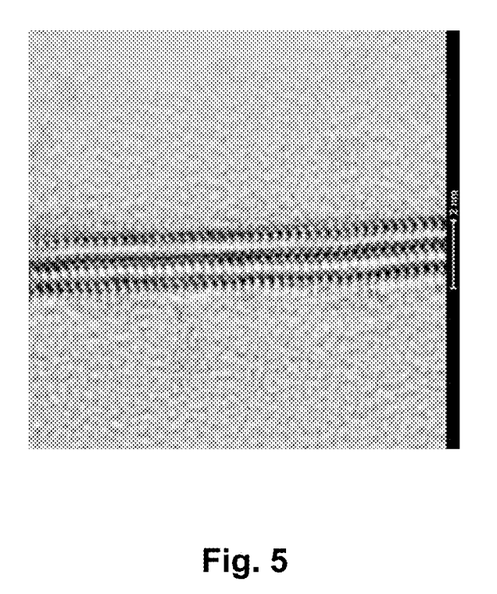
FIG. 5 is an enlarged view of the STEM cross-section view of a $MoS_2$ thin film (2 nm) of FIG. 4.

FIGS. 4 and 5 (scanning transmission electron microscope photos) illustrate a 2 nm thin film of $MoS_2$ obtained according to the invention. This thin film is obtained from tetrakis(dimethylamino)molybdenum (IV) and 1,2-ethanedithiol on an amorphous $SiN_x$ substrate at 100° C. According to the invention, growing such a thin film of 2 nm takes 2 to 3 minutes. The anneal temperature of 1050° C. for 90 seconds allows the formation of a crystalline $MoS_2$ thin film having basal planes parallel to the surface of the substrate on which the ALD was carried out.

The invention claimed is:

1. A method of preparing, by atomic layer deposition (ALD), a crystalline thin film having a formula of $MY_2$ and having a crystal structure that is suitable for electronic applications, the method comprising:
   a first step of preparing an amorphous film having a formula of $MY_x$ by atomic layer deposition on a surface of a substrate from at least one precursor of a metal M and at least one precursor of an element Y,
   wherein x is in a range of 1.5 to 3.1,
   wherein M is tungsten or molybdenum or a mixture thereof,
   wherein a degree of oxidation of metal M in the at least one precursor of metal M is in the range from 3 to 6,
   wherein the metal of the precursor of metal M has bonds consisting of single or multiple bonds M-Z and/or M-M, wherein Z=C, N or H,
   wherein Y is sulfur, selenium, or a mixture thereof,
   wherein the precursors of metal M and of element Y are halogen free, and
   wherein the first step of preparing the amorphous film having the formula $MY_x$ comprises the steps of
      a) introducing, by a single pulse, a first precursor of metal M or of element Y into a deposition chamber of an ALD reactor,
      b) purging the deposition chamber with an inert gas,
      c) introducing, by a single pulse, a second precursor into the deposition chamber, the second precursor being a precursor of metal M when the first precursor is a precursor of element Y, or a precursor of element Y when the first precursor is a precursor of metal M,
      d) purging the deposition chamber with an inert gas,
      e) repeating steps a) to d), wherein a substrate temperature is lower than or equal to 350° C. during steps a) to d) to avoid the formation of crystals that are randomly oriented with respect to the substrate, and
      f) obtaining the amorphous film having the formula $MY_x$; and
   a second step of annealing the amorphous film having the formula $MY_x$ to provide the crystalline film having crystal lattices whose basal planes are stacked in planes parallel to the surface of the substrate on which the crystalline film is formed, so that the crystalline film has a crystal structure suitable for electronic applications.

2. The method of claim 1, wherein the atomic layer deposition comprises introducing into the deposition chamber the precursor of metal M, and then introducing the precursor of element Y, or introducing into the deposition chamber the precursor of element Y, and then introducing the precursor of metal M.

3. The method of claim 1, wherein the substrate temperature is in a range from 0 to 350° C.

4. The method of claim 1, wherein the substrate temperature does not change during steps a) to e).

5. The method of claim 1, wherein the precursor of metal M is selected from the group consisting of $Mo(NMe_2)_4$, $M(=N-CMe_3)_2(NMe_2)_2$, $Mo(NEtMe)_4$, $Mo(NEt_2)_4$, and $M_2(NMe_2)_6$, wherein M=molybdenum or tungsten, Me=$CH_3$, and Et=$CH_2-CH_3$.

6. The method of claim 1, wherein the precursor of element Y is selected from the group consisting of $YR_2$, $Y_2R$, $Y_2R_2$, $Y_3R_2$, and $Y_2R_3$, wherein R=H and/or alkyl and/or allyl and/or aryl, and wherein R=C for $Y_2R$.

7. The method of claim 1, wherein the precursor of element Y is selected from the group consisting of $H_2Y$, 1,2-ethanedithiol, and a $H_2/Y_2R_2$ mixture, wherein R=H and/or alkyl and/or allyl and/or aryl.

8. The method of claim 1, wherein a protective layer is deposited onto the amorphous film $MY_x$ after the first step but before the second step, or after the second step.

9. The method of claim 1, wherein a pre-annealing stage is carried out after the first step but before the second step.

10. The method of claim 1, wherein a pre-annealing stage is carried out after the first step but before the second step, and
wherein a protective layer is deposited onto the amorphous film $MY_x$ after the pre-annealing stage but before the second step.

11. The method of claim 1, wherein an anneal temperature is 350° C. or more.

12. The method of claim 1, wherein the surface of the substrate having the crystalline thin film deposited thereon is made of a material selected from the group consisting of a metal, a semiconductor, an inorganic oxide, an inorganic sulfide, and an inorganic selenide.

13. The method of claim 1, wherein the amorphous film having the formula $MY_x$ has a thickness of less than 100 nanometers.

14. The method of claim 1, wherein the precursor of metal M is selected from the group consisting of $Mo(NMe_2)_4$, $M(=N-CMe_3)_2(NMe_2)_2$, $Mo(NEtMe)_4$, $Mo(NEt_2)_4$, and $M_2(NMe_2)_6$, wherein M=molybdenum or tungsten, Me=—$CH_3$, and Et=—$CH_2$—$CH_3$, and
wherein the precursor of element Y is selected from the group consisting of $YR_2$, $Y_2R$, $Y_2R_2$, $Y_3R_2$, and $Y_2R_3$, wherein R=H and/or alkyl and/or allyl and/or aryl, and wherein R=C for $Y_2R$.

15. The method of claim 1, wherein the annealing step is carried out under an inert atmosphere.

16. The method of claim 1, wherein, before the first step, the surface of the substrate has —OH groups.

17. The method of claim 1, wherein the precursor of metal M is free of cyclopentadienyl ligand.

18. The method of claim 1, wherein the precursor of metal M is $M(=N-CMe_3)_2(NMe_2)_2$ or $Mo(NEtMe)_4$, wherein M=molybdenum or tungsten, Me=—$CH_3$, and Et=—$CH_2$—$CH_3$.

19. A method of preparing, by atomic layer deposition (ALD), a crystalline thin film having a formula of $MY_2$, the method comprising:
a first step of preparing an amorphous film having a formula $MY_x$ by ALD on a surface of a substrate from at least one precursor of a metal M and at least one precursor of an element Y,
wherein x is in a range of 1.5 to 3.1,
wherein M is tungsten, molybdenum or a mixture thereof,
wherein a degree of oxidation of metal M in the at least one precursor of metal M is in a range of 3 to 6,
wherein the metal of the precursor of metal M exclusively has bonds selected from the group consisting of metal nitrogen single bonds, metal nitrogen double bonds, and mixtures thereof,
wherein Y is sulfur, selenium or a mixture thereof,
wherein the precursors of metal M and of element Y are halogen free, and
wherein the first step of preparing the amorphous film having the formula $MY_x$ comprises the steps of
a) introducing, by a single pulse, a first precursor of metal M or element Y into a deposition chamber of an ALD reactor,
b) purging the deposition chamber with an inert gas,
c) introducing, by a single pulse, a second precursor into the deposition chamber, the second precursor being a precursor of metal M when the first precursor is a precursor of element Y, or a precursor of element Y when the first precursor is a precursor of metal M,
d) purging the deposition chamber with an inert gas,
e) repeating steps a) to d) in order to obtain the amorphous film having the formula $MY_x$, wherein a substrate temperature is lower than or equal to 350° C. during steps a) to d) to avoid the formation of crystals that are randomly oriented with respect to the substrate, and
f) obtaining the amorphous film having the formula $MY_x$; and
a second step of annealing the amorphous film having the formula $MY_x$ to provide a crystalline film having crystal lattices whose basal planes are stacked in planes parallel to the surface of the substrate on which the crystalline film is formed, so that the crystalline film has a crystal structure suitable for electronic applications.

20. The method of claim 19, wherein the element Y consists of selenium.

21. A method of preparing, by atomic layer deposition (ALD), a crystalline thin film having a formula of $MY_2$, the method comprising:
a first step of preparing an amorphous film having a formula $MY_x$ by ALD on a surface of a substrate from at least one precursor of a metal M and at least one precursor of an element Y,
wherein x is in a range of 1.5 to 3.1,
wherein M is tungsten, molybdenum or a mixture thereof,
wherein a degree of oxidation of metal M in the at least one precursor of metal M is in a range of 3 to 6,
wherein the metal M of the precursor of metal M has bonds consisting of single or multiple bonds M-Z and/or M-M, wherein Z=C, N or H,
wherein Y is selenium,
wherein the precursors of metal M and of element Y are halogen free, and
wherein the first step of preparing the amorphous film having the formula $MY_x$ comprises the steps of
a) introducing, by a single pulse, a first precursor of metal M or of element Y into a deposition chamber of an ALD reactor,
b) purging the deposition chamber with an inert gas,
c) introducing, by a single pulse, a second precursor into the deposition chamber, the second precursor being a precursor of metal M when the first precursor is a precursor of element Y, or a precursor of element Y when the first precursor is a precursor of metal M,
d) purging the deposition chamber with an inert gas,
e) repeating steps a) to d) in order to provide the amorphous film having the formula $MY_x$, wherein a substrate temperature is lower than or equal to 350° C. during steps a) to d) to avoid the formation of crystals that are randomly oriented with respect to the substrate, and
f) obtaining the amorphous film having the formula $MY_x$; and a second step of annealing the amorphous film having the formula $MY_x$ to provide the crystalline film having the formula $MY_2$, wherein the crystalline film has crystal lattices whose basal planes are stacked in planes parallel to the surface of the substrate on which the crystalline film is formed, so that the crystalline film has a crystal structure suitable for electronic applications.

* * * * *